United States Patent [19]
Mogi

[11] Patent Number: 6,038,243
[45] Date of Patent: Mar. 14, 2000

[54] MULTIPLE BEAM LIGHT SOURCE DEVICE AND MULTIPLE BEAM SCANNING OPTICAL APPARATUS USING THE DEVICE

[75] Inventor: Shin Mogi, Kawasaki, Japan

[73] Assignee: Canon Kabushiki Kaisha, Tokyo, Japan

[21] Appl. No.: 08/972,255

[22] Filed: Nov. 18, 1997

[30] Foreign Application Priority Data

Nov. 21, 1996 [JP] Japan ..................................... 8-325962

[51] Int. Cl.⁷ .............................. H01S 3/19; G01D 15/04
[52] U.S. Cl. ................................ 372/50; 372/43; 372/29; 372/23; 346/107.1
[58] Field of Search ................................ 372/31, 23, 43, 372/50, 29, 33, 27, 105, 106; 347/137, 243, 244; 346/107 R, 108, 107.1

[56] References Cited

U.S. PATENT DOCUMENTS

| | | | |
|---|---|---|---|
| 5,305,342 | 4/1994 | Ota ............................................. | 372/50 |
| 5,610,647 | 3/1997 | Takada ..................................... | 347/137 |
| 5,793,783 | 8/1998 | Endriz ........................................ | 372/31 |
| 5,883,385 | 3/1999 | Takahashi et al. ...................... | 250/235 |

*Primary Examiner*—Brian Healy
*Attorney, Agent, or Firm*—Fitzpatrick, Cella, Harper & Scinto

[57] ABSTRACT

A multiple beam light source device includes a plurality of semiconductor laser chips. The plurality of semiconductor laser chips each have respective emission points independent from each other. The plurality of semiconductor laser chips are mounted such that the emission points are located so as to deviate in a direction to approach each other from positions of the centers of the plurality of semiconductor laser chips.

84 Claims, 6 Drawing Sheets

MULTIPLE BEAM LIGHT SOURCE DEVICE AND MULTIPLE BEAM SCANNING OPTICAL APPARATUS USING THE DEVICE

BACKGROUND OF THE INVENTION

1. Field of the Invention

The present invention relates to a multiple beam light source device used in a multiple beam scanning optical apparatus for undergoing simultaneous writing with multiple beams, such as laser printers or digital copiers.

2. Related Background Art

FIG. 1 is a structural drawing of a conventional multiple beam writing apparatus used in laser printers or the like. A collimator lens 2, a cylindrical lens 3, and polygon mirror 4 for deflecting a plurality of laser beams are arranged in order in front of multiple beam semiconductor laser light source 1 having a plurality of emission points, and scanning lens 5 and photosensitive drum 6 serving as a recording medium are arranged in the area of reflection of polygon mirror 4. Synchronous detection mirror 7 for reflecting part of laser light deflectively reflected by the polygon mirror 4 is located between the scanning lens 5 and the photosensitive drum 6 and synchronous detection sensor 8 is placed in the area of reflection of the synchronous detection mirror 7. The output of laser driving circuit 9 is connected to the multiple beam semiconductor laser light source 1.

FIG. 2 is a perspective view of the conventional multiple beam semiconductor laser light source 1. Trapezoid stem 12 is provided on one surface of base stem 11, and semiconductor laser chip 13 and photodiode 14 are fixed on the trapezoid stem 12. Cap 15 is attached to the base stem 11 so as to cover the trapezoid stem 12 on which these semiconductor laser chip 13 and photodiode 14 are mounted, and window 16, which transmits laser beams La, Lb, is provided in a top surface of cap 15. Conduction terminals 17 for connecting the semiconductor laser chip 13 and photodiode 14 to a laser drive control system not illustrated are provided on the opposite surface of base stem 11. The photodiode 14 receives laser beams La', Lb' emitted backward from the semiconductor laser chip 13.

FIG. 3 is a front elevation of edge emitter type (end face emission type) semiconductor laser chip 13. One semiconductor laser chip 13 on the trapezoid stem 12 is made by vapor phase epitaxy, such as the MOCVD method or the MBE method, to form the n-type polarity of substrate 18, for example, from such a reason that less crystal defects are formed thereby in general. Specifically, the semiconductor laser chip 13 has the total height of about 150 $\mu$m and is constructed in such structure that very thin crystal growth part 19, approximately 10 $\mu$m, is deposited in lamination on the substrate 18 and active layer 20 is formed in the crystal growth part 19.

While a crystal is grown during fabrication of semiconductor laser chip 13, multiple emission points 21a, 21b are formed in the active layer 20. Metal electrodes are fixed to the top face of crystal growth part 19, and conduction wires 22a, 22b are soldered to the respective metal electrodes. As a consequence, the substrate 18 side becomes a common electrode in terms of electrical connection, while on the crystal growth part 19 side electrically separated electrodes are formed by effecting such crystal growth as to isolate the emission points 21a, 21b from each other or by providing a groove between them.

FIG. 4 is an explanatory drawing of beam spots P1, P2 made by the multiple laser beams emitted from the semiconductor light source 1 and scanning the area on the photosensitive drum 6. The beam spots P1, P2 are separated corresponding to adjacent scanning lines in the sub scanning direction and are also separated with a predetermined space S in the main scanning direction. Accordingly, the multiple emission points formed in the semiconductor laser chip 13 in the semiconductor laser light source 1 are positioned in such oblique relation as to be apart in the main scanning direction but as to be close to each other in the sub scanning direction.

When a laser drive signal is transmitted from the laser drive control system through the conduction terminals 17, an electric current is supplied through the conduction wires 22a, 22b to the semiconductor laser chip 13 to make the semiconductor laser chip 13 lase and the laser beams are emitted from the two emission points 21a, 21b disposed in the front face through the window 16.

In this way, the multiple laser beams emitted from the semiconductor laser light source 1 pass the collimator lens 2 and cylindrical lens 3 and thereafter are deflected by the polygon mirror 4 to scan. After that, they pass the scanning lens 5 to be focused on the photosensitive drum 6 and to scan the photosensitive drum 6. At this time, the laser beams emitted from the respective emission points 21a, 21b are positioned in an offset state in the sub scanning direction with respect to the writing scanning lines, so that the different, adjacent emission points are in charge of the respective, adjacent scanning line.

For synchronous detection in write scanning on the photosensitive drum 6, the synchronous detection sensor 8 captures the laser light emitted outside the effective write region and at a time immediately before write via the synchronous detection mirror 7. Therefore, the laser emission operation is carried out twice upon effective write and upon synchronous detection by drive of the laser drive circuit 9.

Further, APC (Automatic Power Control) is carried out for each emission point 21a, 21b in order to keep laser light amounts constant. This APC operation is carried out in such a way that the emission points 21a, 21b are made to lase separately and the beams La', Lb' emitted from the back surface of the semiconductor laser chip 13 at this time are detected by the photodiode 14 as changed in time division.

(1) However, the conventional example described above has such a drawback that, because the multiple emission points 21a, 21b are provided in one semiconductor laser chip 13, thermal crosstalk occurs from the adjacent emission point 21a, 21b and this results in variation of light amount between the emission points 21a, 21b.

(2) Since the electrodes of the emission points 21a, 21b of the semiconductor laser chip 13 are common on the cathode side or the n-type substrate 18 side, the conventional example has such a drawback that the number of choices is small for arranging the laser emission drive method in a laser emission circuit method adapted to image signals.

(3) Further, when a surface emission type semiconductor laser is used as the multiple beam semiconductor laser light source, directions of polarization of the respective emission points 21a, 21b are sometimes not identical. In such cases, the conventional example has such a drawback that nonuniformity appears in write light amounts on the occasion of scanning with their multiple laser beams through the optical elements including the polygon mirror 4 and scanning lens 5.

SUMMARY OF THE INVENTION

A first object of the present invention is to provide a multiple beam light source device that assures a desired space between the emission points and thus decreases the influence of mutual thermal crosstalk between the adjacent emission points, solving the above problem (1).

A second object of the present invention is to provide a multiple beam light source device that has increased degrees of freedom for connection on a laser drive circuit basis and for the driving method based thereon by use of an n-type substrate laser chip, solving the above problem (2).

A third object of the present invention is to provide a multiple beam light source device using a surface emission type semiconductor laser chip as a multiple beam semiconductor laser light source, wherein the directions of polarization of laser beams from the respective adjacent emission points are nearly identical whereby transmissivities and reflectivities of the laser beams passing the optical elements are made equivalent to each other, solving the above problem (3).

A multiple beam light source device according to the present invention for achieving the above objects is a multiple beam light source device with multiple emission points used in laser beam printer apparatus for performing optical writing on a photosensitive member, which has a plurality of semiconductor laser chips using an n-type substrate, in which the emission points are formed in said respective, separate semiconductor laser chips independent of each other, and in which the emission points are located at positions close to each other as deviating from positions of the centers of the semiconductor laser chips.

The above multiple beam light source device has a plurality of surface emission type semiconductor laser chips and is arranged so that polarization directions of the respective laser beams from the plural emission points are aligned substantially in one direction.

DETAILED DESCRIPTION OF THE PREFERRED EMBODIMENTS

The present invention will be described in detail, based on the embodiments illustrated in FIG. 5 to FIG. 12.

Since the overall structure of the multiple beam scanning optical apparatus is substantially the same as that shown in FIG. 1, the description thereof is omitted herein and only the multiple beam semiconductor laser light source will be described.

Figure 5:
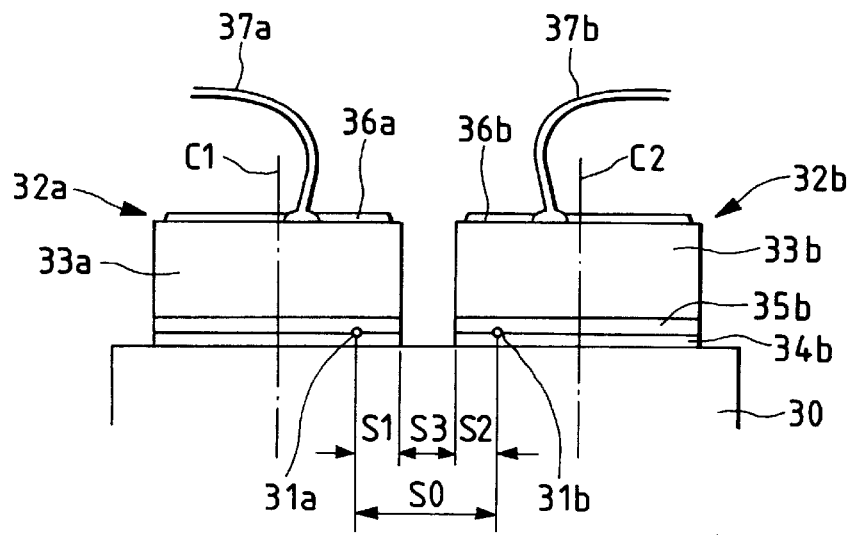
FIG. 5 is a front elevation of a semiconductor laser chip mounted portion of the first embodiment of the present invention.
Figure 6:
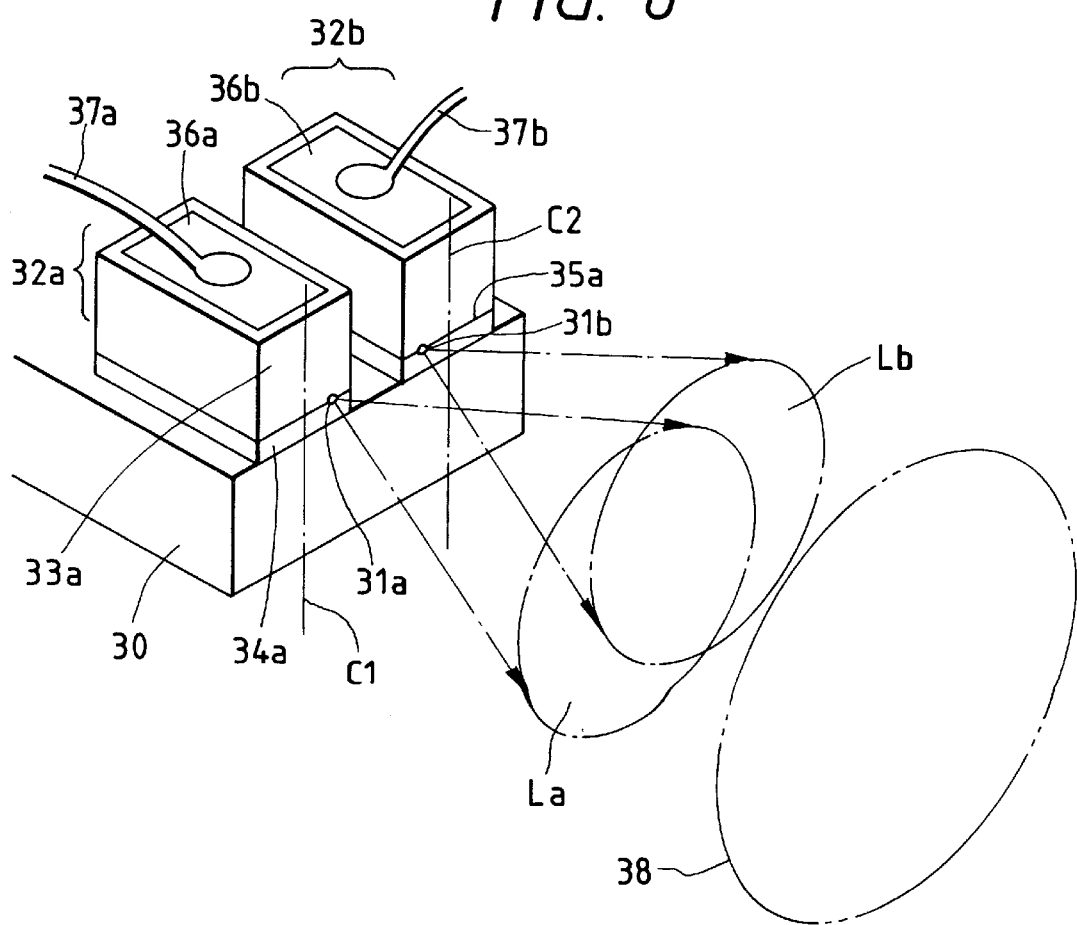
FIG. 6 is a perspective view of FIG. 5.

FIG. 5 is a front elevation of the semiconductor laser chip mounted portion of the first embodiment and FIG. 6 is a perspective view thereof. Semiconductor laser chips 32a, 32b, each having one independent emission point 31a, 31b, are formed on the trapezoid stem 30. Each of the semiconductor laser chips 32a, 32b is composed of substrate 33a, 33b and crystal growth portion 34a, 34b, and the crystal growth portion 34a, 34b has the opposite polarity to that of the substrate 33a, 33b. An active layer 35a, 35b is made in each crystal growth portion 34a, 34b and an emission point 31a, 31b is provided on the front face side in the active layer 35a, 35b. Here, S0 represents a space between the emission points 31a and 31b, S1, S2 each a space between the emission point 31a, 31b and a central side face of the semiconductor laser chip 32a, 32b, and S3 a space between the semiconductor laser chips 32a and 32b.

Conduction electrode 36a, 36b is mounted on the top face of semiconductor laser chip 32a, 32b by vapor deposition or the like, and conduction wire 37a, 37b is connected to the conduction electrode 36a, 36b. Namely, the separate emission points 31a, 31b are formed in the respective semiconductor laser chips 32a, 32b, and power is supplied through the conduction electrode 36a, 36b provided on the top face and a similar electrode provided on the bottom face and not illustrated.

Figure 7:
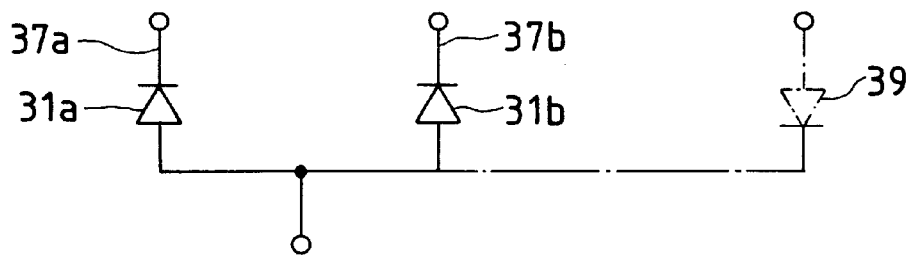
FIG. 7 is a structural diagram of an electric circuit of the multiple beam semiconductor laser light source.

The laser beams La, Lb emitted from the respective emission points 31a, 31b at this time are indicated by dashed lines in FIG. 6 and a glass window 38, through which the laser beams La, Lb are outgoing from a part of the semiconductor laser package, is indicated by a chain double-dashed line. Each of C1 and C2 represents the center line of the semiconductor laser chip 32a, 32b when observed from the front thereof. FIG. 7 is an electrical connection diagram of the multiple laser emission points 31a, 31b, wherein a built-in photodiode 39 is indicated by a chain double-dashed line.

The laser beams La, Lb from the respective emission points 31a, 31b of the semiconductor laser light source are emitted toward the window 38 mounted in the semiconductor laser package to become the laser light for undergoing the optical writing action on the photosensitive member with multiple beams.

In the present embodiment the semiconductor laser chips 32a, 32b are made by vapor phase epitaxy with the main component of GaAs, and the substrates 33a, 33b are of the n-type, i.e. of the so-called cathode polarity, because substrates of the p-type of electrical polarity have many crystal defects and are not available for use in practice. Accordingly, the electrodes of the crystal growth portions 34a, 34b are of the p-type, or thus of the anode polarity in an electrical aspect.

Figure 3:
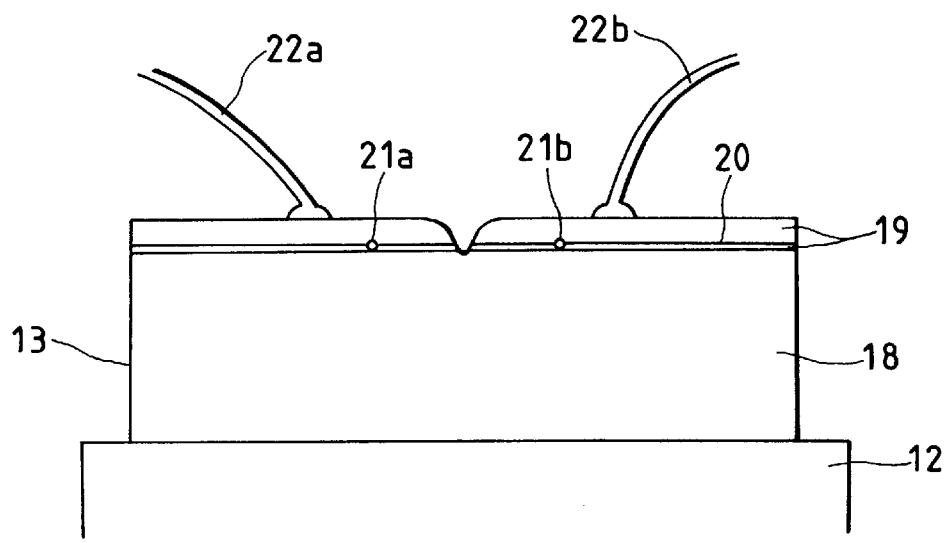
FIG. 3 is a front elevation of the semiconductor laser chip.
Figure 4:
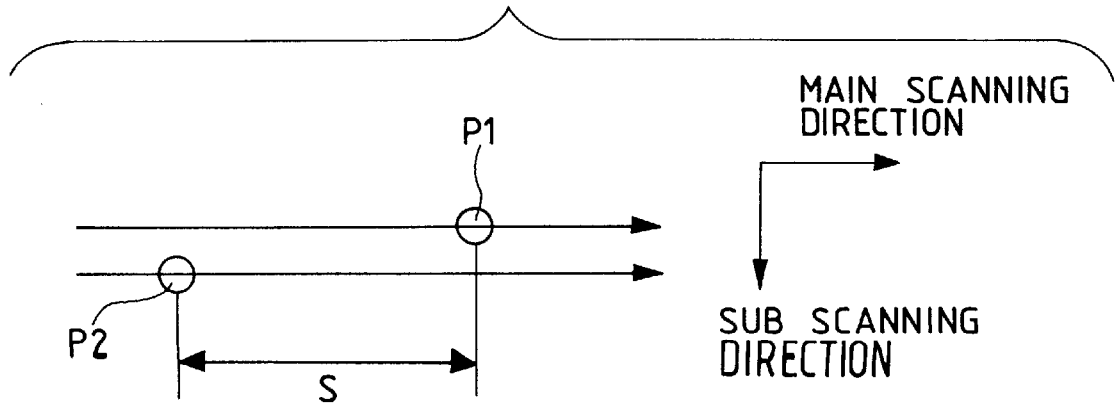
FIG. 4 is an explanatory drawing of the scanning beam spots.

In the conventional case, where the multiple emission points are formed in the crystal growth portion 19 on the n-type substrate 18 as shown in FIG. 3, the p-type side can be electrically separated, but the n-type side is common because of the same substrate 18; thus, the structure is of the so-called cathode common type. In general, circuits for driving the cathode common type structure, however, have a drawback that they are not suitable for high image frequencies, because they basically have to use pnp transistors.

Therefore, when the semiconductor laser chips 32a, 32b are of the separate type as in the present embodiment, the structure can be of the so-called anode common type wherein the common electrode of the semiconductor laser chips 32a, 32b is the p-type side, though using the two n-type substrates 33a, 33b. This permits us to use npn transistors quick on the driving circuit basis, thus increasing choices of circuit method and adapting the circuit to the image frequencies.

The trapezoid stem 30 also functions as an electrode, but use of the separate type semiconductor laser chips 32a, 32b obviates the need for making their polarities common to either the anode or the cathode by separation of trapezoid stem 30 and also permits us to choose connection for drive of separate emission. However, the number of terminals will increase in this case, and thus, preferably, the polarities should be selected based on the relation with the circuit method at that time.

The multiple beam semiconductor laser light source of the present embodiment, different from a single beam semiconductor laser light source having one emission point, has two emission points 31a, 31b located at partially offset positions. When they are observed from the front side of semiconductor laser chips 32a, 32b, the two emission points 31a, 31b deviate in a direction to approach each other as shown in FIG. 5 from the center positions C1, C2 in terms of the mechanical dimensions.

For example, when the space S0 between the emission points 31a, 31b is about 100 µm, the spaces S1 and S2, which are distances from the emission points 31a, 31b to the end face of each semiconductor laser chip 32a, 32b, are about 30 µm and the space S3 between the end faces of the semiconductor laser chips 32a, 32b is about 40 µm. Accordingly, supposing the width of the semiconductor laser chips 32a, 32b, when observed from the front side thereof, is 250 µm, the emission points 31a, 31b are located so as to deviate toward their adjacent emission point 31a, 31b.

In general, too large spaces between the emission points 31a, 31b will pose a problem of increase in optical aberration due to the imaging lens for capturing the multiple laser beams so as to increase the sizes of beam spots on the photosensitive member; too narrow spaces between the emission points will pose a problem of increase in the thermal crosstalk being variation in light amount due to heat from adjacent emission point 31a, 31b.

Accordingly, a desired arrangement is such that the distances S1, S2 from the emission points 31a, 31b to the end faces of respective semiconductor laser chips 32a, 32b satisfy S1≈S2 and 10 µm<S1<100 µm, the space S3 between the adjacent semiconductor laser chips 32a, 32b satisfies S3<200 µm, and the space S0 between the emission points 31a, 31b satisfies 30 µm<S0<250 µm.

In this way, the emission points 31a, 31b can be spaced relatively close to each other and the emission points 31a, 31b are separated from each other in the respective semiconductor laser chips 32a, 32b. Therefore, this arrangement of the present embodiment can decrease the thermal crosstalk as compared with the conventional arrangement in which the multiple emission points are formed in one semiconductor laser chip.

The wavelength of laser light emitted from the semiconductor laser light source is 800 nm or less. Since chip sizes are nearly equal in the case of the semiconductor laser chips having the wavelengths of 800 nm and less, such as 785 nm and 680 nm, the heat-radiation property will not be degraded if each chip size is the same as that in the conventional arrangement of single emission point, when compared with an arrangement of simply decreased chip size.

Further, the placement of the emission points 31a, 31b at the deviating positions in the respective semiconductor laser chips 32a, 32b permits us to relatively arbitrarily set the space between the emission points 31a, 31b. In addition, if the shapes of plural semiconductor laser chips 32a, 32b are mirror-symmetric shapes including the positions and the sizes of emission points 31a, 31b, the heat-radiation property etc. will be identical and these will be little difference in the characteristics including the light amount variation between the emission points 31a, 31b.

Figure 8:
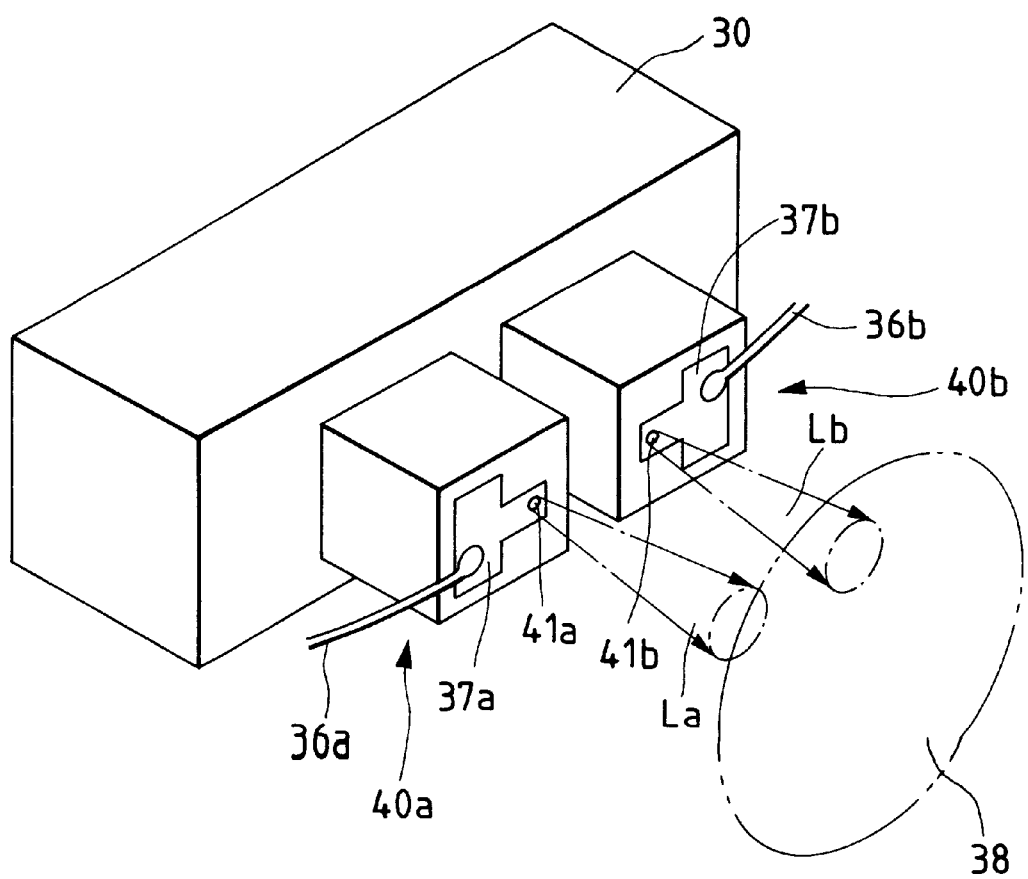
FIG. 8 is a perspective view of the semiconductor laser chip mounted portion of the second embodiment.
Figure 9:
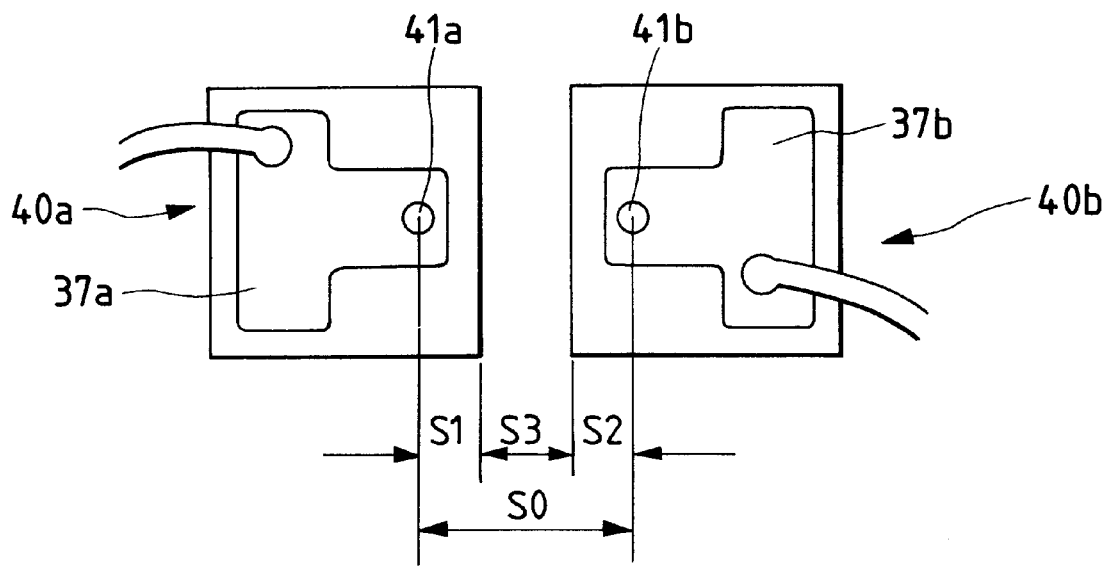
FIG. 9 is a plan view of a plurality of surface emission type semiconductor laser chips.
Figure 10:
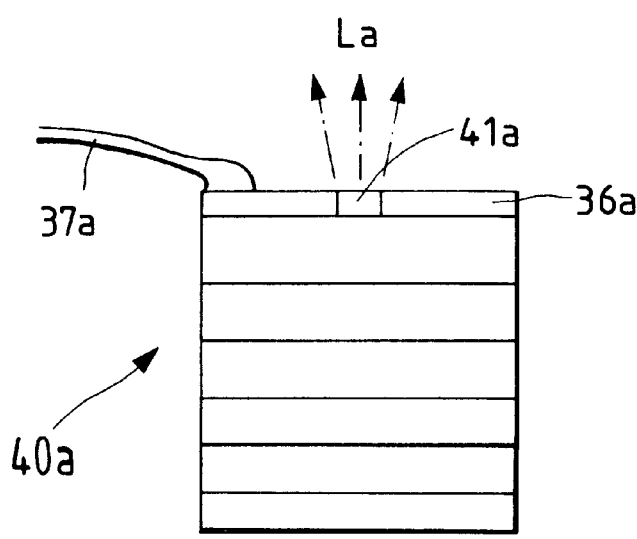
FIG. 10 is a side view of FIG. 9.

FIG. 8 is a perspective view of the mounted portion of surface emission type semiconductor laser chips of the second embodiment, FIG. 9 is a front elevation of the surface emission type semiconductor laser chips, and FIG. 10 is a side view thereof. The surface emission type semiconductor laser chips 40a, 40b are disposed on a front side face of trapezoid stem 30 and an emission point 41a, 41b of each surface emitting laser is provided in the surface emission type semiconductor laser chip 40a, 40b. The same reference symbols as those in the first embodiment denote the same members or the like.

In the present embodiment the action of the light source for optical writing is also the same as in the first embodiment, and the semiconductor laser chips 40a, 40b are those called VCSEL (Vertical Cavity Surface Emitting Laser) of the surface emission type greatly different in an emission area of emission point. This VCSEL has the emission point 41a, 41b on the crystal growth plane, whereas the conventional edge emitter type laser has the emission point in the side end face of crystal in the lamination of semiconductor laser chip. Therefore, the laser emission part and the conduction electrode 36a, 36b are located on the same plane in VCSEL, whereas they are on the different surfaces in the edge emitter type semiconductor laser chip.

In the multiple beam semiconductor laser light source of the present embodiment, the emission points 41a, 41b and conduction electrodes 36a, 36b are located on the same surface with respect to the package window 38 and the electrodes not illustrated are also provided on the mount surface side of the semiconductor laser chips 40a, 40b. Thus, the semiconductor laser chips 40a, 40b are located on the end face of trapezoid stem 30 on the window 38 side and are arranged in a type to be powered by use of the trapezoid stem 30. Since these VCSELs are of the structure to emit the laser light only in one direction, no laser light is emitted from the other surface of semiconductor laser chips 40a, 40b on the trapezoid stem 30 side.

The VCSELs of the present embodiment are made in the stack structure of plural crystal layers on the substrate in its fabrication process in the same manner as the edge emitter type (end face emission type) semiconductor laser chips shown in FIG. 5, and those are made using the n-type substrate by vapor phase epitaxy. Each of semiconductor laser chips 40a, 40b separately provided on the plural substrates has one emission point 41a, 41b, similarly as in the first embodiment; and for the emission points 41a, 41b to be spaced at a desired space, the plural emission points are located close to each other as shown in FIG. 9 in the laser emission surfaces.

Further, the best way for equaling the heat radiation from the emission points 41a, 41b is to employ the mirror-symmetric shape of the sizes of the respective semiconductor laser chips 40a, 40b and the positions of the emission points 41a, 41b in the emission surfaces. For that purpose, when the space between the two emission points 41a, 41b is defined as S0, they are located in the relation of spaces S1=S2 in the same manner as in the first embodiment. The space S3 is an intermediate layer of air. Since thermal insulation is good between the semiconductor laser chips 40a, 40b, when observed from one emission point 41a, the thermal crosstalk, being the light amount variation due to the heat from the adjacent emission point 40b, can be decreased greatly.

As described above, when the separate surface emission type semiconductor laser chips 40a, 40b are placed corresponding to the respective emission points 41a, 41b, desired electrical connection can be made, regardless of the polarities of the substrates of semiconductor laser chips 40a, 40b, and the thermal crosstalk can be decreased.

Figure 11:
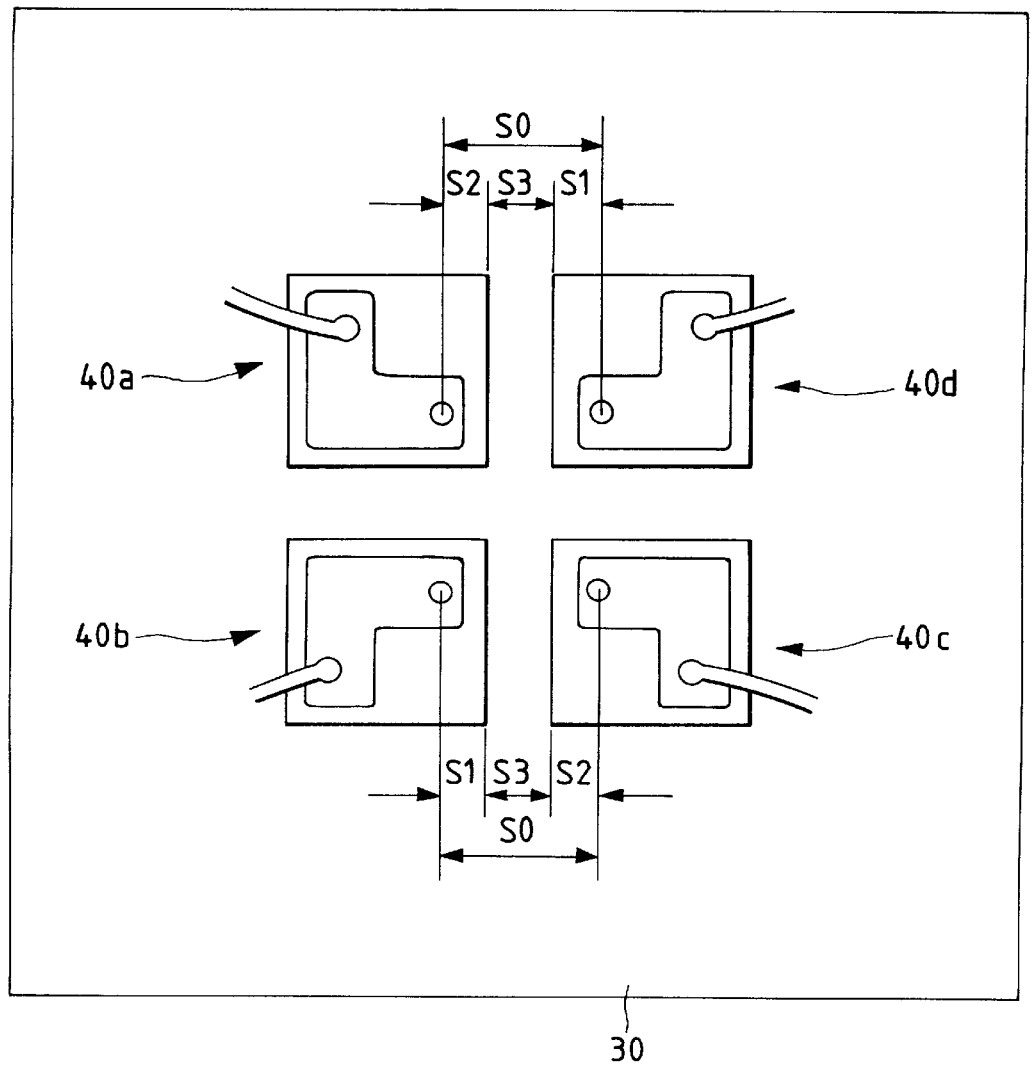
FIG. 11 is a plan view of a modification of the second embodiment.

The second embodiment described above has the two surface emission type semiconductor laser chips 40a, 40b, but it is also possible to employ a modification shown in FIG. 11 wherein four surface emission type semiconductor laser chips 40a, 40b, 40c, 40d are arranged so that a plurality of adjacent emission points are located at deviating positions to approach each other in the regions in the laser emission surfaces.

Since use of the four surface emission type semiconductor laser chips as in this modification permits four beam spots to scan the photosensitive member, further quicker writing can be done.

Figure 12:
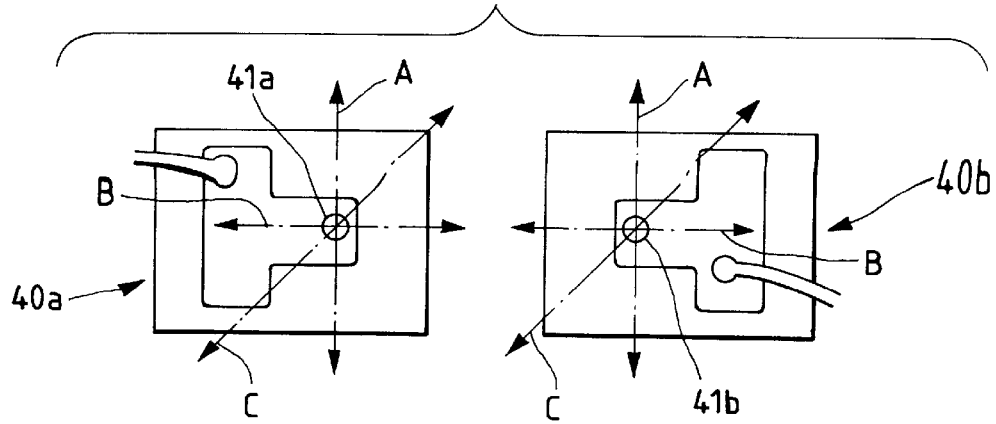
FIG. 12 is a plan view of a plurality of surface emission type semiconductor laser chips of the third embodiment.

FIG. 12 is a plan view of the chip mounted portion comprised of surface emission type semiconductor laser chips in the third embodiment. FIG. 12 shows an example using a plurality of surface emission type semiconductor laser chips 40a, 40b, each having one emission point 41a, 41b.

The surface emission type semiconductor laser light source of the third embodiment has such polarization characteristics of linearly polarized light that the direction of electric field vector of laser light emitted therefrom is fixed in one direction, similar to the edge emitter type semiconductor laser light source. In the case of the edge emitter type semiconductor laser, the laser light is linearly polarized light, but an angle of polarization direction is parallel to the layers of the crystal lamination portion of laser chip; further, the emission point is not of a complete round, but oblate; it is thus presumed that these are closely related to the polarization direction (angle).

On the other hand, in the case of the surface emission type semiconductor laser light source, the laser light emerging therefrom is emitted in the direction of lamination of crystals and the emission point thereof is of a complete round. Accordingly, nothing regulates the polarization direction of laser light and thus the polarization direction cannot be specified.

Figure 1:
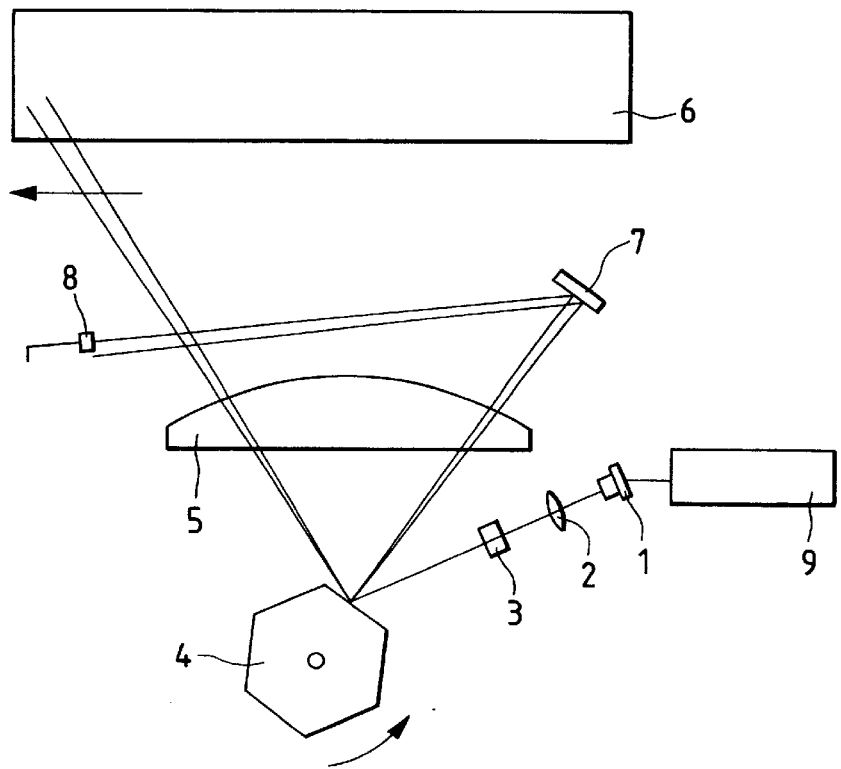
FIG. 1 is a plan view of the multiple beam writing device of the conventional example.
Figure 2:
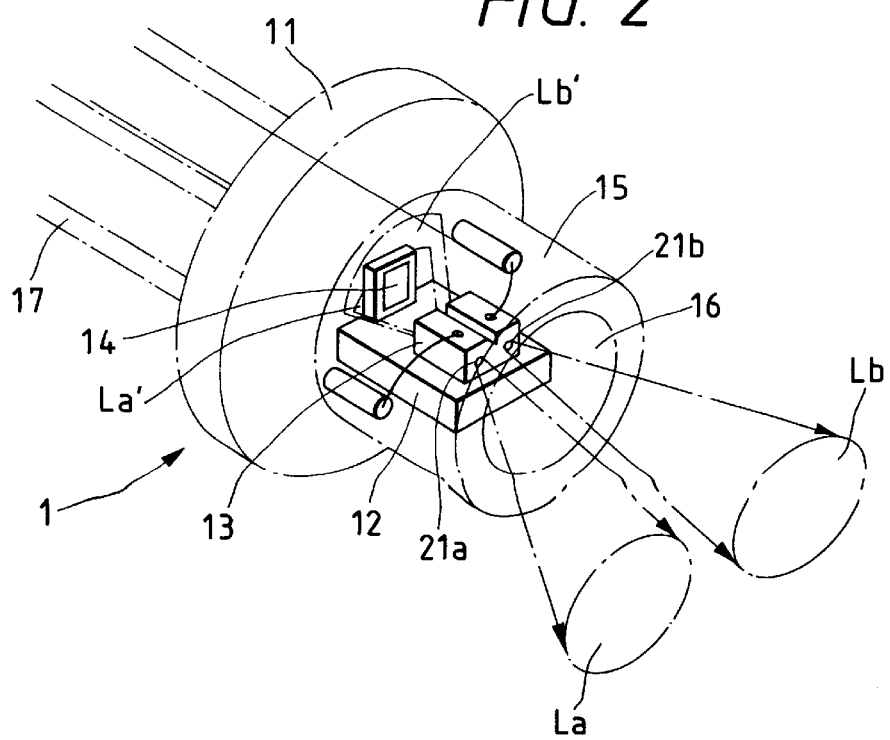
FIG. 2 is a perspective view of the multiple beam semiconductor laser light source.

Since the multiple beam writing apparatus is composed of the polygon mirror 4, scanning lens 5, etc. as shown in FIG. 1 of the conventional example so as to effect reflection and transmission of the laser light, the reflectivity and transmissivity of laser light depend upon the direction of plane of polarization and vary depending upon the direction of polarization, angle of incidence, angle of reflection, and so on. Accordingly, if directions of polarization differ among the individual laser beams, illumination light amounts will be different on the photosensitive member; especially, when amounts of adjacent laser beams are different, print density differences due to the light amount difference will appear apparent to the human eyes, thus being a cause of degradation of print quality.

In this third embodiment nonuniformity of illumination light amount on the photosensitive member is decreased by aligning the polarization directions of plural laser beams from the emission points 41a, 41b of the surface emission type semiconductor laser chips 40a, 40b with direction A or direction B or direction C. For this purpose, the polarization characteristics of the surface emission type semiconductor laser chips 40a, 40b are checked upon fabrication and those with nearly equal angles are assembled together. The most effective way of this check is to carry out this check when many surface emission type laser chips are arrayed on a fabricated wafer. Angular errors of these polarization directions upon assembly are kept within 15°, whereby dispersion of reflectivity and transmissivity is decreased upon passage of laser light through the optical elements and nonuniformity of writing light amount onto the photosensitive member can be suppressed practically.

As described above, in the case of the surface emission type semiconductor laser chips 40 being used, the difference in light amount between the adjacent laser beams for scanning writing on the photosensitive member can also be decreased by aligning the polarization directions of the multiple emission points 41a, 41b with the same direction, whereby the nonuniformity of print density can be decreased.

As described above, the multiple beam light source device according to the present invention uses the separate semiconductor laser chips for the respective emission points and employs such arrangement that the emission points are located as deviating to approach their adjacent emission points in the emission surfaces of semiconductor laser chips, whereby it can improve the quality of write or print with securing the desired space between the emission points and suppressing the light amount variation due to the thermal crosstalk from the adjacent emission point and whereby electrical connection of multiple emission points can be arbitrarily set irrespective of the polarities of substrates forming the semiconductor laser chips, thus allowing arbitrary selection of electrical drive circuit method. As a result, stable image quality can be achieved by selecting the optimum circuit for the image frequencies.

The above multiple beam light source device using the plurality of surface emission type semiconductor laser chips employs such arrangement that the polarization directions of the respective laser beams emitted from the emission points are aligned substantially with the same direction, whereby it can achieve the image quality with stable image density while suppressing the light amount difference between the laser beams projected onto the photosensitive member.

What is claimed is:

1. A multiple beam light source device comprising:
   a plurality of semiconductor laser chips, said plurality of semiconductor laser chips each having respective emission points independent from each other; and
   a member on which said plurality of semiconductor laser chips are mounted,
   wherein said emission points are located so as to deviate in a direction to approach each other from positions of the centers of said plurality of semiconductor laser chips, and
   wherein wavelengths of multiple laser beams emitted from said plurality of semiconductor laser chips are not more than 800 nm.

2. A multiple beam light source device according to claim 1, wherein in said direction to approach each other a distance S1 from each emission point to an end face of each semiconductor laser chip is in a range of 10 μm to 100 μm and a distance S3 between end faces of adjacent semiconductor laser chips is not more than 200 μm.

3. A multiple beam light source device according to claim 1, wherein said plurality of semiconductor laser chips are two semiconductor laser chips.

4. A multiple beam light source device according to claim 1, wherein said plurality of semiconductor laser chips are four semiconductor laser chips.

5. A multiple beam light source device according to claim 1, wherein said plurality of semiconductor laser chips are semiconductor laser chips made using an n-type substrate.

6. A multiple beam light source device according to claim 1, wherein said plurality of semiconductor laser chips are end face emission type semiconductor laser chips or surface emission type semiconductor laser chips fabricated by vapor phase epitaxy.

7. A multiple beam light source device according to claim 1, wherein said plurality of semiconductor laser chips are surface emission type semiconductor laser chips and directions of polarization of plural laser beams emitted from said plurality of semiconductor laser chips are aligned substantially with a direction.

8. A multiple beam scanning optical apparatus comprising:
a plurality of semiconductor laser chips, said plurality of semiconductor laser chips each having respective emission points independent from each other;
a member on which said plurality of semiconductor laser chips are mounted; and
deflecting means for deflecting a plurality of laser beams emitted from said plurality of semiconductor laser chips,
wherein said emission points are located so as to deviate in a direction to approach each other from positions of the centers of said plurality of semiconductor laser chips, and
wherein wavelengths of multiple laser beams emitted from said plurality of semiconductor laser chips are not more than 800 nm.

9. A multiple beam scanning optical apparatus according to claim 8, wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

10. A multiple beam scanning optical apparatus according to claim 8, wherein said plurality of semiconductor laser chips are two semiconductor laser chips.

11. A multiple beam scanning optical apparatus according to claim 8, wherein said plurality of semiconductor laser chips are four semiconductor laser chips.

12. A multiple beam scanning optical apparatus according to claim 8, wherein said plurality of semiconductor laser chips are semiconductor laser chips made using an n-type substrate.

13. A multiple beam scanning optical apparatus according to claim 8, wherein said plurality of semiconductor laser chips are end face emission type semiconductor laser chips or surface emission type semiconductor laser chips fabricated by vapor phase epitaxy.

14. A multiple beam scanning optical apparatus according to claim 8, wherein said plurality of semiconductor laser chips are surface emission type semiconductor laser chips and directions of polarization of plural laser beams emitted from said plurality of semiconductor laser chips are aligned substantially with a direction.

15. A laser beam printer apparatus comprising:
a plurality of semiconductor laser chips, said plurality of semiconductor laser chips each having respective emission points independent from each other;
a member on which said plurality of semiconductor laser chips are mounted;
deflecting means for deflecting a plurality of laser beams emitted from said plurality of semiconductor laser chips; and
a recording medium to which the plurality of laser beams deflected by said deflecting means are guided,
wherein said emission points are located so as to deviate in a direction to approach each other from positions of the centers of said plurality of semiconductor laser chips, and
wherein wavelengths of multiple laser beams emitted from said plurality of semiconductor laser chips are not more than 800 nm.

16. A laser beam printer apparatus according to claim 15, wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

17. A laser beam printer apparatus according to claim 15, wherein said plurality of semiconductor laser chips are two semiconductor laser chips.

18. A laser beam printer apparatus according to claim 15, wherein said plurality of semiconductor laser chips are four semiconductor laser chips.

19. A laser beam printer apparatus according to claim 15, wherein said plurality of semiconductor laser chips are semiconductor laser chips made using an n-type substrate.

20. A laser beam printer apparatus according to claim 15, wherein said plurality of semiconductor laser chips are end face emission type semiconductor laser chips or surface emission type semiconductor laser chips fabricated by vapor phase epitaxy.

21. A laser beam printer apparatus according to claim 15, wherein said plurality of semiconductor laser chips are surface emission type semiconductor laser chips and directions of polarization of plural laser beams emitted from said plurality of semiconductor laser chips are aligned substantially with a direction.

22. A multiple beam light source device comprising:
a plurality of semiconductor laser chips, said plurality of semiconductor laser chips each having respective emission points independent from each other; and
a member on which said plurality of semiconductor laser chips are mounted,
wherein said emission points are located so as to deviate in a direction to approach each other from positions of the centers of said plurality of semiconductor laser chips, and
wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

23. A multiple beam light source device according to claim 22, wherein wavelengths of multiple laser beams emitted from said plurality of semiconductor laser chips are not more than 800 nm.

24. A multiple beam light source device according to claim 22, wherein said plurality of semiconductor laser chips are two semiconductor laser chips.

25. A multiple beam light source device according to claim 22, wherein said plurality of semiconductor laser chips are four semiconductor laser chips.

26. A multiple beam light source device according to claim 22, wherein said plurality of semiconductor laser chips are semiconductor laser chips made using an n-type substrate.

27. A multiple beam light source device according to claim 22, wherein said plurality of semiconductor laser chips are end face emission type semiconductor laser chips or surface emission type semiconductor laser chips fabricated by vapor phase epitaxy.

28. A multiple beam light source device according to claim 22, wherein said plurality of semiconductor laser chips are surface emission type semiconductor lasers chips and directions of polarization of plural laser beams emitted from said plurality of semiconductor laser chips are aligned substantially with a direction.

29. A multiple beam scanning optical apparatus comprising:
a plurality of semiconductor laser chips, said plurality of semiconductor laser chips each having respective emission points independent from each other;
a member on which said plurality of semiconductor laser chips are mounted; and
deflecting means for deflecting a plurality of laser beams emitted from said plurality of semiconductor laser chips,
wherein said emission points are located so as to deviate in a direction to approach each other from positions of the centers of said plurality of semiconductor laser chips, and
wherein in said direction to approach each other a distance S1 from each emission point to an end face of each semiconductor laser chip is in a range of 10 μm to 100 μm and a distance S3 between end faces of adjacent semiconductor laser chips is not more than 200 μm.

30. A multiple beam scanning optical apparatus according to claim 29, wherein wavelengths of multiple laser beams emitted from said plurality of semiconductor laser chips are not more than 800 nm.

31. A multiple beam scanning optical apparatus according to claim 29, wherein said plurality of semiconductor laser chips are two semiconductor laser chips.

32. A multiple beam scanning optical apparatus according to claim 29, wherein said plurality of semiconductor laser chips are four semiconductor laser chips.

33. A multiple beam scanning optical apparatus according to claim 29, wherein said plurality of semiconductor laser chips are semiconductor laser chips made using an n-type substrate.

34. A multiple beam scanning optical apparatus according to claim 29, wherein said plurality of semiconductor laser chips are end face emission type semiconductor laser chips or surface emission type semiconductor laser chips fabricated by vapor phase epitaxy.

35. A multiple beam scanning optical apparatus according to claim 29, wherein said plurality of semiconductor laser chips are surface emission type semiconductor laser chips and directions of polarization of plural laser beams emitted from said plurality of semiconductor laser chips are aligned substantially with a direction.

36. A laser beam printer apparatus comprising:
a plurality of semiconductor laser chips, said plurality of semiconductor laser chips each having respective emission points independent from each other;
a member on which said plurality of semiconductor laser chips are mounted;
deflecting means for deflecting a plurality of laser beams emitted from said plurality of semiconductor laser chips; and
a recording medium to which the plurality of laser beams deflected by said deflecting means are guided,
wherein said emission points are located so as to deviate in a direction to approach each other from positions of the centers of said plurality of semiconductor laser chips, and
wherein in said direction to approach each other a distance S1 from each emission point to an end face of each semiconductor laser chip is in a range of 10 μm to 100 μm and a distance S3 between end faces of adjacent semiconductor laser chips is not more than 200 μm.

37. A laser beam printer apparatus according to claim 36, wherein wavelengths of multiple laser beams emitted from said plurality of semiconductor laser chips are not more than 800 nm.

38. A laser beam printer apparatus according to claim 36, wherein said plurality of semiconductor laser chips are two semiconductor laser chips.

39. A laser beam printer apparatus according to claim 36, wherein said plurality of semiconductor laser chips are four semiconductor laser chips.

40. A laser beam printer apparatus according to claim 36, wherein said plurality of semiconductor laser chips are semiconductor laser chips made using an n-type substrate.

41. A laser beam printer apparatus according to claim 36, wherein said plurality of semiconductor laser chips are end face emission type semiconductor laser chips or surface emission type semiconductor laser chips fabricated by vapor phase epitaxy.

42. A laser beam printer apparatus according to claim 36, wherein said plurality of semiconductor laser chips are surface emission type semiconductor laser chips and directions of polarization of plural laser beams emitted from said plurality of semiconductor laser chips are aligned substantially with a direction.

43. A multiple beam light source device comprising:
a plurality of semiconductor laser chips, said plurality of semiconductor laser chips each having respective emission points independent from each other; and
a member on which said plurality of semiconductor laser chips are mounted,
wherein said emission points are located so as to deviate in a direction to approach each other from positions of the centers of said plurality of semiconductor laser chips, and
wherein said plurality of semiconductor laser chips are semiconductor laser chips made using an n-type substrate.

44. A multiple beam light source device according to claim 43, wherein wavelengths of multiple laser beams emitted from said plurality of semiconductor laser chips are not more than 800 nm.

45. A multiple beam light source device according to claim 43, wherein in said direction to approach each other a distance S1 from each emission point to an end face of each semiconductor laser chips is in a range of 10 μm to 100 μm and a distance S3 between end faces of adjacent semiconductor laser chips is not more than 200 μm.

46. A multiple beam light source device according to claim 43, wherein said plurality of semiconductor laser chips are two semiconductor laser chips.

47. A multiple beam light source device according to claim 43, wherein said plurality of semiconductor laser chips are four semiconductor laser chips.

48. A multiple beam light source device according to claim 43, wherein said plurality of semiconductor laser chips are end face emission type semiconductor laser chips or surface emission type semiconductor laser chips fabricated by vapor phase epitaxy.

49. A multiple beam light source device according to claim 43, wherein said plurality of semiconductor laser chips are surface emission type semiconductor laser chips and directions of polarization of plural laser beams emitted from said plurality of semiconductor laser chips are aligned substantially with a direction.

50. A multiple beam scanning optical apparatus comprising:

a plurality of semiconductor laser chips, said plurality of semiconductor laser chips each having respective emission points independent from each other;

a member on which said plurality of semiconductor laser chips are mounted; and deflecting means for deflecting a plurality of laser beams emitted from said plurality of semiconductor laser chips, wherein said emission points are located so as to deviate in a direction to approach each other from positions of the centers of said plurality of semiconductor laser chips, and wherein said plurality of semiconductor laser chips are semiconductor laser chips made using an n-type substrate.

51. A multiple beam scanning optical apparatus according to claim 50, wherein wavelengths of multiple laser beams emitted from said plurality of semiconductor laser chips are not more than 800 nm.

52. A multiple beam scanning optical apparatus according to claim 50, wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

53. A multiple beam scanning optical apparatus according to claim 50, wherein said plurality of semiconductor laser chips are two semiconductor laser chips.

54. A multiple beam scanning optical apparatus according to claim 50, wherein said plurality of semiconductor laser chips are four semiconductor laser chips.

55. A multiple beam scanning optical apparatus according to claim 50, wherein said plurality of semiconductor laser chips are end face emission type semiconductor laser chips or surface emission type semiconductor laser chips fabricated by vapor phase epitaxy.

56. A multiple beam scanning optical apparatus according to claim 50, wherein said plurality of semiconductor laser chips are surface emission type semiconductor laser chips and directions of polarization of plural laser beams emitted from said plurality of semiconductor laser chips are aligned substantially with a direction.

57. A laser beam printer apparatus comprising:

a plurality of semiconductor laser chips, said plurality of semiconductor laser chips each having respective emission points independent from each other;

a member on which said plurality of semiconductor laser chips are mounted;

deflecting means for deflecting a plurality of laser beams emitted from said plurality of semiconductor laser chips; and a recording medium to which the plurality of laser beams deflected by said deflecting means are guided, wherein said emission points are located so as to deviate in a direction to approach each other from positions of the centers of said plurality of semiconductor laser chips, and wherein said plurality of semiconductor laser chips are semiconductor laser chips made using an n-type substrate.

58. A laser beam printer apparatus according to claim 57, wherein wavelengths of multiple laser beams emitted from said plurality of semiconductor laser chips are not more than 800 nm.

59. A laser beam printer apparatus according to claim 57, wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

60. A laser beam printer apparatus according to claim 57, wherein said plurality of semiconductor laser chips are two semiconductor laser chips.

61. A laser beam printer apparatus according to claim 57, wherein said plurality of semiconductor laser chips are four semiconductor laser chips.

62. A laser beam printer apparatus according to claim 57, wherein said plurality of semiconductor laser chips are end face emission type semiconductor laser chips or surface emission type semiconductor laser chips fabricated by vapor phase epitaxy.

63. A laser beam printer apparatus according to claim 57, wherein said plurality of semiconductor laser chips are surface emission type semiconductor laser chips and directions of polarization of plural laser beams emitted from said plurality of semiconductor laser chips are aligned substantially with a direction.

64. A multiple beam light source device comprising:

a plurality of semiconductor laser chips, said plurality of semiconductor laser chips each having respective emission points independent from each other; and a member on which said plurality of semiconductor laser chips are mounted, wherein said emission points are located so as to deviate in a direction to approach each other from positions of the centers of said plurality of semiconductor laser chips, and wherein said plurality of semiconductor laser chips are surface emission type semiconductor laser chips and directions of polarization of plural laser beams emitted from said plurality of semiconductor laser chips are aligned substantially with a direction.

65. A multiple beam light source device according to claim 64, wherein wavelengths of multiple laser beams emitted from said plurality of semiconductor laser chips are not more than 800 nm.

66. A multiple beam light source device according to claim 64, wherein in said direction to approach each other a distance S1 from each emission point to an end face of each semiconductor laser chip is in a range of 10 $\mu$m to 100 $\mu$m and a distance S3 between end faces of adjacent semiconductor laser chips is not more than 200 $\mu$m.

67. A multiple beam light source device according to claim 64, wherein said plurality of semiconductor laser chips are two semiconductor laser chips.

68. A multiple beam light source device according to claim 64, wherein said plurality of semiconductor laser chips are four semiconductor laser chips.

69. A multiple beam light source device according to claim 64, wherein said plurality of semiconductor laser chips are semiconductor laser chips made using an n-type substrate.

70. A multiple beam light source device according to claim 64, wherein said plurality of semiconductor laser chips are end face emission type semiconductor laser chips or surface emission type semiconductor laser chips fabricated by vapor phase epitaxy.

71. A multiple beam scanning optical apparatus comprising:

a plurality of semiconductor laser chips, said plurality of semiconductor laser chips each having respective emission points independent from each other;

a member on which said plurality of semiconductor laser chips are mounted; and deflecting means for deflecting a plurality of laser beams emitted from said plurality of semiconductor laser chips, wherein said emission points are located so as to deviate in a direction to approach each other from positions of the centers of said plurality of semiconductor laser chips, and wherein said plurality of semiconductor laser chips are surface emission type semiconductor laser chips and directions of polarization of plural laser beams emitted from said plurality of semiconductor laser chips are aligned substantially with a direction.

72. A multiple beam scanning optical apparatus according to claim 71, wherein wavelengths of multiple laser beams emitted from said plurality of semiconductor laser chips are not more than 800 nm.

73. A multiple beam scanning optical apparatus according to claim 71, wherein in said direction to approach each other a distance S1 from each emission point to an end face of each semiconductor laser chip is in a range of 10 μm to 100 μm and a distance S3 between end faces of adjacent semiconductor laser chips is not more than 200 μm.

74. A multiple beam scanning optical apparatus according to claim 71, wherein said plurality of semiconductor laser chips are two semiconductor laser chips.

75. A multiple beam scanning optical apparatus according to claim 71, wherein said plurality of semiconductor laser chips are four semiconductor laser chips.

76. A multiple beam scanning optical apparatus according to claim 71, wherein said plurality of semiconductor laser chips are semiconductor laser chips made using an n-type substrate.

77. A multiple beam scanning optical apparatus according to claim 71, wherein said plurality of semiconductor laser chips are end face emission type semiconductor laser chips or surface emission type semiconductor laser chips fabricated by vapor phase epitaxy.

78. A laser beam printer apparatus comprising:

a plurality of semiconductor laser chips, said plurality of semiconductor laser chips each having respective emission points independent from each other;

a member on which said plurality of semiconductor laser chips are mounted;

deflecting means for deflecting a plurality of laser beams emitted from said plurality of semiconductor laser chips; and a recording medium to which the plurality of laser beams deflected by said deflecting means are guided, wherein said emission points are located so as to deviate in a direction to approach each other from positions of the centers of said plurality of semiconductor laser chips, and wherein said plurality of semiconductor laser chips are surface emission type semiconductor laser chips and directions of polarization of plural laser beams emitted from said plurality of semiconductor laser chips are aligned substantially with a direction.

79. A laser beam printer apparatus according to claim 78, wherein wavelengths of multiple laser beams emitted from said plurality of semiconductor laser chips are not more than 800 nm.

80. A laser beam printer apparatus according to claim 78, wherein in said direction to approach each other a distance S1 from each emission point to an end face of each semiconductor laser chip is in a range of 10 μm to 100 μm and a distance S3 between end faces of adjacent semiconductor laser chips is not more than 200 μm.

81. A laser beam printer apparatus according to claim 78, wherein said plurality of semiconductor laser chips are two semiconductor laser chips.

82. A laser beam printer apparatus according to claim 78, wherein said plurality of semiconductor laser chips are four semiconductor laser chips.

83. A laser beam printer apparatus according to claim 78, wherein said plurality of semiconductor laser chips are semiconductor laser chips made using an n-type substrate.

84. A laser beam printer apparatus according to claim 78, wherein said plurality of semiconductor laser chips are end face emission type semiconductor laser chips or surface emission type semiconductor laser chips fabricated by vapor phase epitaxy.

* * * * *

UNITED STATES PATENT AND TRADEMARK OFFICE
CERTIFICATE OF CORRECTION

PATENT NO. : 6,038,243

DATED : March 14, 2000

INVENTOR(S): SHIN MOGI

It is certified that error appears in the above-identified patent and that said Letters Patent is hereby corrected as shown below:

<u>Column 6</u>

```
Line 8, "these" should read --there--.
Line 31, "of" should read --of the--.
```

Signed and Sealed this

Twenty-second Day of May, 2001

*Attest:*

NICHOLAS P. GODICI

*Attesting Officer*     *Acting Director of the United States Patent and Trademark Office*